United States Patent [19]

Sumi et al.

[11] Patent Number: 5,110,393
[45] Date of Patent: May 5, 1992

[54] METHOD OF PEELING A BONDED FILM FROM A CIRCUIT BOARD

[75] Inventors: Shigeo Sumi, Saitama; Ichio Fukuda, Tokyo, both of Japan

[73] Assignee: Somar Corporation, Tokyo, Japan

[21] Appl. No.: 532,408

[22] Filed: Jun. 4, 1990

[30] Foreign Application Priority Data

Jun. 4, 1989 [JP] Japan .................................. 1-141969

[51] Int. Cl.[5] .............................................. B32B 31/18
[52] U.S. Cl. .................................. 156/344; 156/584; 406/19; 29/DIG. 78
[58] Field of Search ............................ 156/344, 584; 29/DIG. 78; 406/19, 20, 88

[56] References Cited

U.S. PATENT DOCUMENTS

| | | |
|---|---|---|
| 3,071,918 | 1/1963 | Hofstetter ................ 29/DIG. 78 X |
| 3,738,592 | 6/1973 | Smith et al. .......................... 406/19 |
| 4,961,817 | 10/1990 | Seki ...................................... 156/584 |
| 5,000,816 | 3/1991 | Seki et al. ............................ 156/584 |

Primary Examiner—Michael W. Ball
Assistant Examiner—Mark A. Osele
Attorney, Agent, or Firm—Sughrue, Mion, Zinn, Macpeak & Seas

[57] ABSTRACT

An apparatus for bonding a multi-layer thin film onto a substrate and for removing a layer of the film. A printed circuit board having a multi-layer film bonded to a planar surface thereof has one layer of the film lifted at a leading edge by vibration and fluid pressure. The leading edge is mechanically gripped and a pulling force applied thereto to draw the film from the surface of the circuit board and to transfer the removed film along a path to a discharge apparatus. The transfer apparatus includes frictionally engaged belts which direct the film along a transfer path to a source of ionized fluid which is applied to the film in order to remove static and direct the film along the transfer path towards a used film receptacle.

10 Claims, 7 Drawing Sheets

METHOD OF PEELING A BONDED FILM FROM A CIRCUIT BOARD

FIELD OF THE INVENTION

This invention relates to a film peeling technique by which a film bonded to a board is separated therefrom and is discharged.

BACKGROUND OF THE INVENTION

Printed circuit boards used in electronic devices, such as a computer, have predetermined patterns (made of copper or the like) formed on one side or on each side of an insulating substrate or board. Such printed circuit boards can be manufactured by the following process. First, a laminate, composed of a photosensitive resin (photoresist) layer and a light-permeable resin cover film protecting the photosensitive resin layer, is laminated onto an electrically-conductive layer on an insulating board under heat and pressure. Then, a wiring pattern film is superposed on the laminate, and the photosensitive resin layer is exposed for a predetermined period of time through the wiring pattern film and the cover film. Then, after the cover film is removed, the exposed photosensitive resin layer is developed to thereby form an etching mask pattern. Thereafter, the unnecessary portions of the electrically-conductive layer are removed by etching and, further, the remaining photosensitive resin layer is removed, thereby forming a printed wiring board having a predetermined wiring pattern.

In the above process of manufacturing the printed circuit board, a step of peeling the cover film prior to developing the exposed photosensitive resin layer, is required. Conventionally, the separation of the cover film is carried out manually. Since the cover film is thin, exceptional dexterity and skill are required so that the photosensitive resin layer is not damaged or destroyed due to irregularities in the separation force applied by the worker.

For this reason, an automatic film peeling apparatus has been developed for automatically effecting the cover film peeling step.

One such conventional film peeling apparatus, is disclosed in Japanese Patent Application No. 101909/88, filed earlier by the Applicant of the present application. In that earlier apparatus, part of a film bonded to a board is manually separated therefrom. Then the automatic film separation is started at that portion of the film immediately adjacent to the manually separated part, and after its complete removal, the film is discharged. More specifically, such film peeling apparatus comprises a first film transfer structure that holds the separated portion of the film and moves or transfers the film upward from the top planar surface of the board so as to separate the film from the board, and a second film transfer structure for blowing a fluid (e.g. air) onto the film, transferred by the first film transfer structure, so as to transfer the film to a separated film-receiving structure.

However, in the conventional film peeling apparatus, the film may become stuck on a wall of an air duct through which the film, passes as it is transferred to the separated film-receiving structure by the air blown onto the film. This results in the blocking of the air duct and presents significant difficulties in achieving a continuous efficient operation.

An object of this invention is to provide a film peeling method by which a film bonded to a board is transferred and discharged while peeling the film from the board, and an incomplete transfer of the separated film is minimized.

Another object of the invention is to provide a technique by which a film peeling apparatus is simplified in construction, thereby facilitating the operation and maintenance of the apparatus.

The above and other objects and novel features of the invention will become manifest upon making reference to the description of the specification and accompanying drawings.

SUMMARY OF THE INVENTION

According to the present invention, there is provided a film peeling method wherein part of a film bonded to a board is separated therefrom, and the remaining film is separated in such a manner that the film separation is started at that portion of the film immediately adjacent to the separated part, the method comprising a first film transfer step of holding the separated part of the film, peeling the film from the board, and transferring the film upwardly from the top planar surface of the board while holding the film; and a second film transfer step of injecting a fluid onto the film, transferred in the first film transfer step, in a static-eliminating atmosphere each time the film separation is effected, thereby transferring the film to a separated film receiving container portion.

The first film transfer step comprises peeling the film in a direction substantially perpendicular to the top planar surface of the board, and transferring the film. The second film transfer step comprises injecting a fluid onto the film in a direction substantially perpendicular to a path of travel of the board and in a plane parallel to the top planar surface of the board, and further injection a horizontal fluid onto the film at a central portion of the transfer path after a predetermined time period during the second transfer step.

The second film transfer step further comprises injecting a fluid, containing ions, on the film in the direction substantially perpendicular to the path of travel of the board and in a plane parallel to the top planar surface of the board, and further injecting horizontally a fluid, containing ions, onto the film at the central portion of the transfer path after a predetermined time period during the second transfer step.

At one end of the horizontally injected fluid in the second film transfer step is a vertical film discharge passage and at a portion of the vertical film discharge passage that is lower than the horizontal fluid, the fluid pressure is reduced. In fact, the fluid pressure is rapidly reduced to substantially zero in the separated film receiving portion.

There is provided an air duct for directing the horizontal fluid flow in the second film transfer step, the air duct being made of a transparent material. An upper wall and one side wall of the air duct are formed integrally with each other to provide an integral portion which is connected by a hinge to a body portion for movement between an open and a closed position.

DESCRIPTION OF THE PREFERRED EMBODIMENTS

Figure 1:
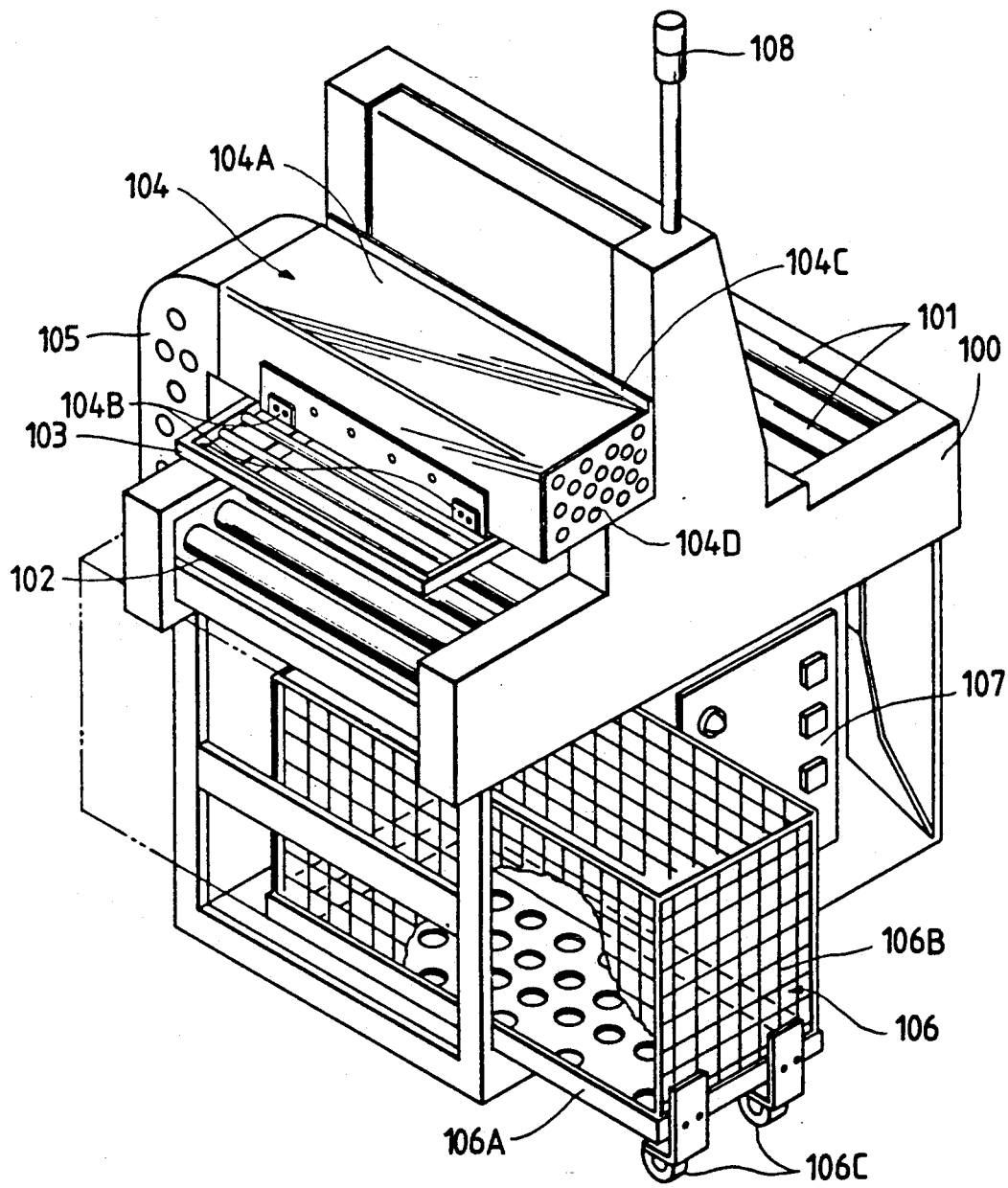
FIG. 1 is a perspective view generally showing the appearance of a film peeling apparatus embodying the present invention.

In all the figures of the drawings, those parts performing the same functions, respectively, will be denoted by identical reference numerals, respectively, and repeated descriptions thereof will be omitted.

A preferred embodiment of the invention applied to a cover film (protective film) peeling apparatus will now be described with references to the drawings, the cover film being used for a printed circuit board.

Figure 2:
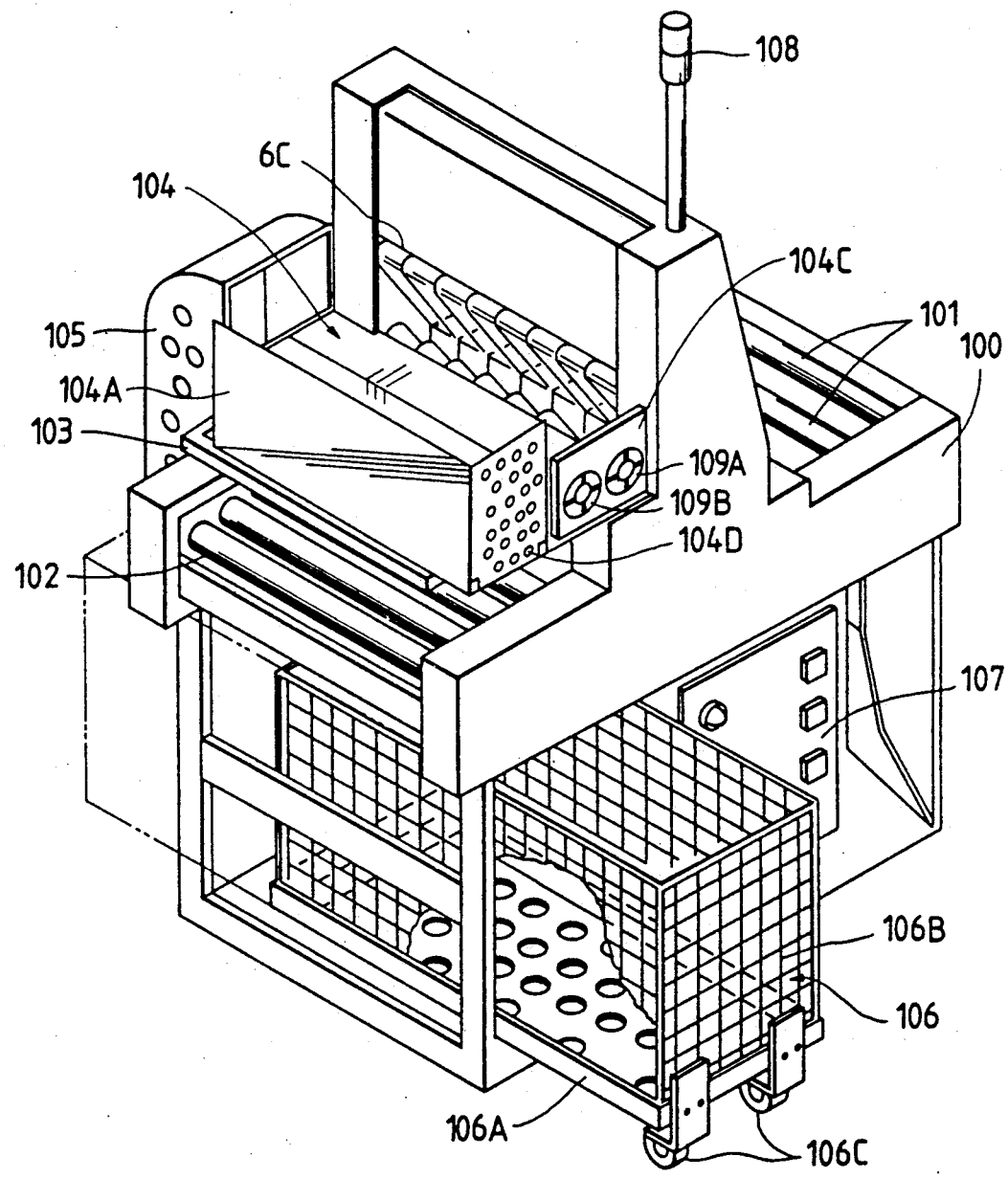
FIG. 2 is a view similar to FIG. 1 but showing an air transfer box in its open condition.

FIG. 1 is a perspective view, generally showing the overall construction of a preferred embodiment of a printed circuit board-film peeling apparatus of the present invention. FIG. 2 is a view similar to FIG. 1, but showing an air-transfer box in its open condition.

The film peeling apparatus of this embodiment comprises a printed circuit board transfer mechanism which includes board transfer rollers 101 and 102 mounted on a body 100 of the apparatus, as shown in FIGS. 1 and 2. An air duct mounting member 103 is mounted above the board transfer rollers 102.

An air duct 104 made of a transparent material is mounted on the air duct mounting member 103. A separated film-discharge duct 105 having a number of pressure-reducing holes is connected to the air duct 104. An upper wall and one side wall of the air duct 104 are formed integrally with each other to form a lid portion 104A which is connected by a hinge 104B to a body portion 104C so as to move between an open and a closed position.

Vent holes 104D are provided in a predetermined portion of the lid portion 104A. Blower fans 109A and 109B for ion insertion purposes are mounted on that portion of the body portion 104C disposed in opposed relation to the vent holes 104D.

A discharge port of the separated film-discharge duct 105 leads to a separated film-receiving container 106 for receiving the separated film. The separated film-receiving container 106 comprises a perforated base 106A having a number of pressure-reducing holes, a net element 106B, and casters 106C.

An operating panel 107 is mounted on the side of the apparatus body 100, and an alarm lamp 108 is mounted on the top of the apparatus body 100.

Figure 3:
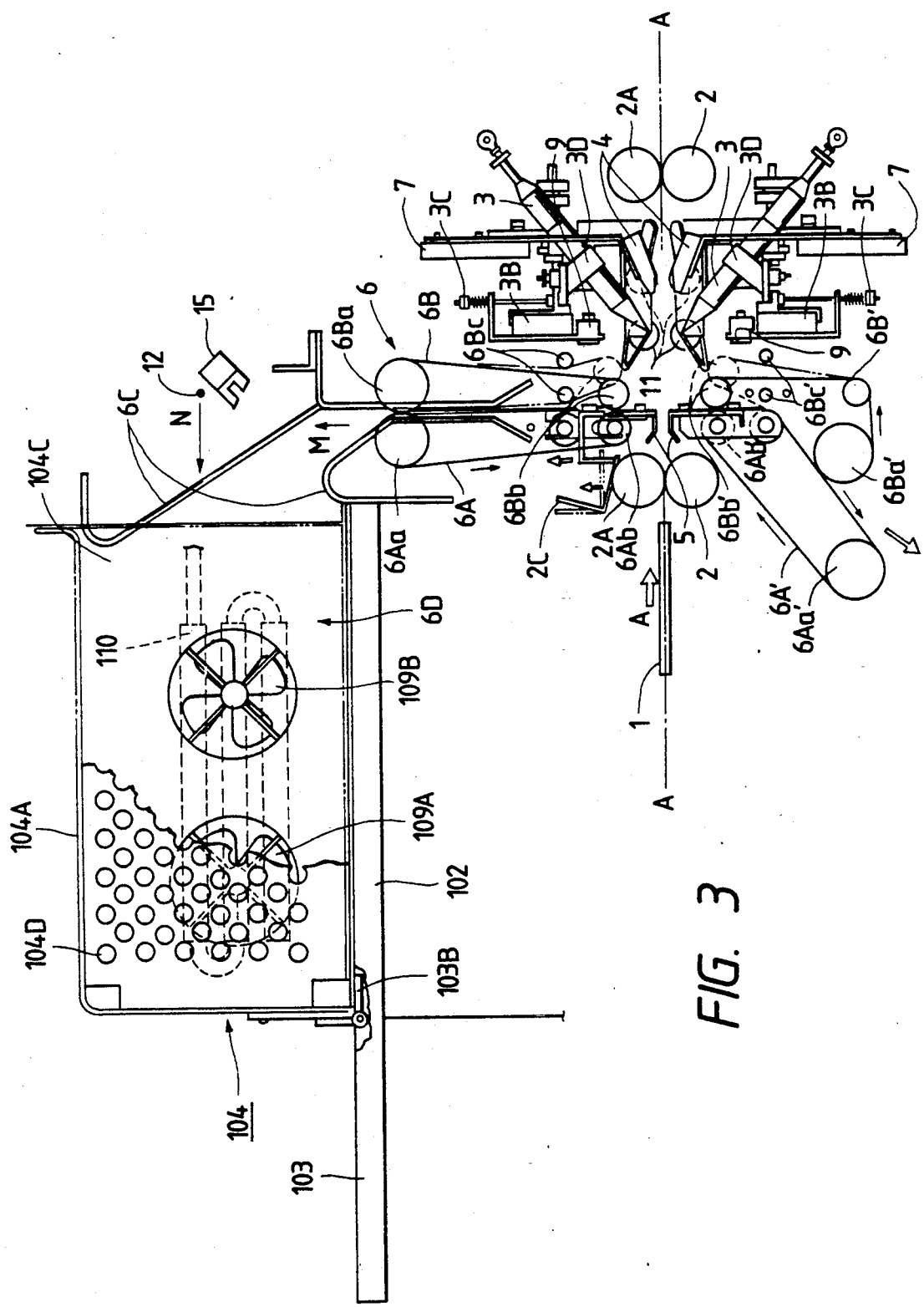
FIG. 3 is a view showing important portions of the film peeling apparatus of FIG. 1.

As shown in FIG. 3, floating members 3 of a film floating device, nozzles 4 of a fluid spray device, peeling direction-determining plates (separation-assisting plates) 5, and a film transfer device (film discharge devices) 6 are arranged along a board travel path A—A.

A printed circuit board 1 has an electrically-conductive layer of copper or the like formed on one side or on each side of an insulating substrate or board. A laminate, composed of a photosensitive resin layer (photoresist layer) and a cover film (protective film), is laminated under heat and pressure onto the electrically-conductive layer on the printed circuit board 1. A predetermined pattern film has been superposed on the photosensitive resin layer, and the photosensitive resin layer has been exposed. The printed circuit board 1 is transferred by drive rollers 2 of the board transfer rollers 101 and 102 in a direction of arrow A in FIG. 3. A pinch roller 2A operates in conjunction with each drive roller 2 for holding the board.

The film floating device, constructed as shown in FIG. 3, includes at least one floating member 3 on each side of the printed circuit board 1. The floating member 3 has a needle-like distal end whose orientation is adjustable by a support structure comprising a clamp 3D that holds the body of floating member 3 and is engaged with a rotatable shaft and manual crank mechanism 3C for turning the shaft. The floating member 3 is vibrated by an air vibration device. The air vibration device applies vibrations, for example, 2000 to 3000 strokes per minute, to the floating member 3.

The distal end of the floating member 3 is adapted to be pressed against and vibrate the end of the laminate film, composed of the photosensitive resin layer and the cover film, that is, to apply energy to the laminate film end. At the end of the laminate film supplied with this energy, the cover film rises out of (or separates from) the photosensitive resin layer. Only the cover film is separated at the end of the laminate supplied with the energy because that cover film is greater than the photosensitive resin layer and the strength of bonding between the photosensitive resin layer and the electrically-insulating layer is greater than the strength of bonding between the photosensitive resin layer and the cover film.

Figure 4:
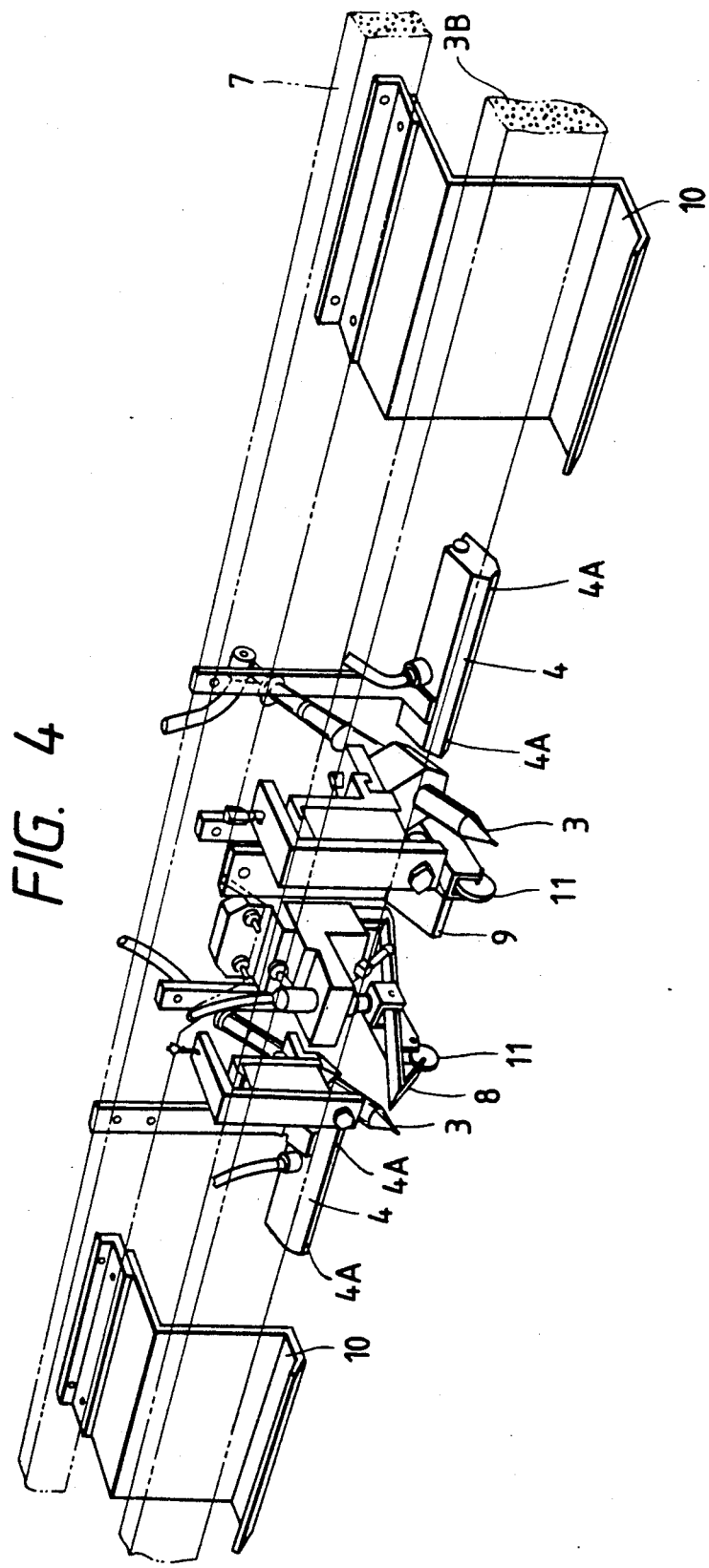
FIG. 4 is a view showing the layout of parts of a film floating device shown in FIG. 3.

As shown in FIGS. 3 and 4, in the fluid spray device, a pressurized fluid such as gas (e.g., air, inert gas) and liquid (e.g., water) is injected from the nozzle 4. In the present embodiment, air is used as this fluid. The fluid spray device sprays the fluid directly into the gap between the photosensitive resin layer and the cover film lifted thererfrom by the film floating member 3. The nozzle 4 of the fluid spray device is disposed near to the floating member 3 so that the nozzle 4 can immediately inject the fluid into the above gap. The nozzle 4 has a pair of injection ports 4A for injecting the fluid toward the distal end of the floating member 3 from both sides (i.e., from two directions). The fluid is supplied from a single fluid supply pipe to the nozzles 4. The nozzle 4 is provided with the pair of injection ports in order to positively effect the film separation operation.

The operation for raising the end of the laminate on the printed circuit board 1 and the peeling operation are the same as those described in Japanese Patent Application No. 101909/88 and, therefore, explanations thereof are omitted here.

The leading end of the cover film separated by the fluid spray device which is directed in the direction of travel of the board is urged against the separating direction-determining plate 5 by the fluid pressure applied from the nozzles 4.

FIG. 4 shows the layout of the various parts of the film floating device shown in FIG. 3. In FIG. 4, when the cover film is to be separated from a thin board, thin board-guide members 10 and thin board-guide rollers 11 serve to guide the thin board so that the leading end portion of the thin board will not hang downwardly, since transfer rollers cannot be incorporated because the floating members 3 and the nozzles 4 are mounted on the film floating device. The thin board-guide members are particularly effective for a wide board.

As shown in FIG. 3, the film transfer device mainly comprises an upper film transfer device disposed on the upper side of the path A—A of travel of the printed wiring-purpose board 1, and a lower film transfer device disposed on the lower side of the board travel path. The upper film transfer device comprises first film transfer belts 6A, 6B, separated film guide members 6C, and a film transfer device 6D. The separated film is guided by the first film transfer belts, comprising fixed belt 6A and adjustable belt 6B, and the separated film guide members 6C as indicated by arrow M, and is transferred to the film transfer device 6D. Belt 6A rotates about rollers 6A*a* and 6A*b* in a counterclockwise direction and is fixed as to its position in defining a transfer path in the direction of arrow M. Belt 6B rotates about rollers 6B*a*, 6B*b* and 6B*c* and is adjustable in the direction of the arrow at roller 6B*b* to pinch a film, and is oriented to further define the transfer path in the direction of arrow M.

The separated film guide members 6C are designed to change the direction of transfer of the separated film from a vertical direction to a horizontal direction which is parallel to the board travel path A—A and is opposite to this board travel path. The separated film guide member 6C are constituted by rod-like elements so that the area of contact of the member 6C with the separated film can be as small as possible. The plurality of separated film guide members 6C are arranged in a direction generally perpendicular to the path A—A for travel of the printed circuit board 1. The separated film guide member 6C is made of an electrically-conductive material, such as stainless copper, which acts to dissipate electrostatic charge produced in the separated film when peeling it or transferring it.

When the separated film is to be transferred from the first film transfer belts 6A, 6B to the film transfer device 6D, the separated film guide member 6C also serve to prevent the separated film from being caught by a roller 6A*a* of fixed transfer belt 6A and a roller 6B*a* of adjustable transfer belt 6B.

A fluid injecting device 12 and an ion generating device (static eliminator) 15 are provided in the vicinity of the separated film guide member 6C. The fluid injecting device 12 is adapted to inject a fluid in a direction of arrow N, parallel to the board travel path A—A and perpendicular to the first film transfer path direction M. The ion generating device (static eliminator) 15 serves to eliminate static charge from the separated film when the separated film is being transferred from the first film transfer belts 6A, 6B to the film transfer device 6D, thereby preventing the separated film from being caught by the roller of the fixed transfer belt 6A and the roller of the movable transfer belt 6B.

In FIGS. 3 and 4, a press plate 2C is used for braking the pinch roller 2A. A fixed support member 7 and support member 3B provide mounting structures for the various components. A film end-detecting member 8 and other limit switches, including a detection member 9 for confirming whether the film separated by the action of the fluid is caused to positively rise toward the separating direction-determining plate, are used to control the operation of the device.

Finally, fixed belts 6A' and adjustable belt 6B' comprise the second film transfer belts and, together with rollers 6A*a'*, 6A*b'*, 6B*a'*, 6B*b'*, 6B*c'* and 6B*d'* define the lower film transfer device. Each of the belts 6A, 6A', 6B and 6B' comprises a toothed rubber belt, and all the rollers except for the rollers 6B*c* and 6B*c'* comprise toothed pulleys, respectively. This arrangement is to ensure a positive movement of the belts.

The film transfer device 6D is mounted on the air duct mounting member 103. As shown in FIGS. 1 and 2, the film transfer device 6D comprises an air duct 104, and a cover film discharge duct 105 is connected to the air duct 104, as described above. The upper wall and one side wall of the air duct 104 are formed integrally with each other to form the lid portion 104A which is connected by the hinge 104B to the body portion 104C so as to move between an open and a closed portion. The vent holes 104D are provided in predetermined portion of the lid portion 104A. Blower fans 109A and 109B for ion insertion purposes are mounted on that portion of the body portion 104C disposed in opposed relation to the vent holes 104D.

Figure 5:
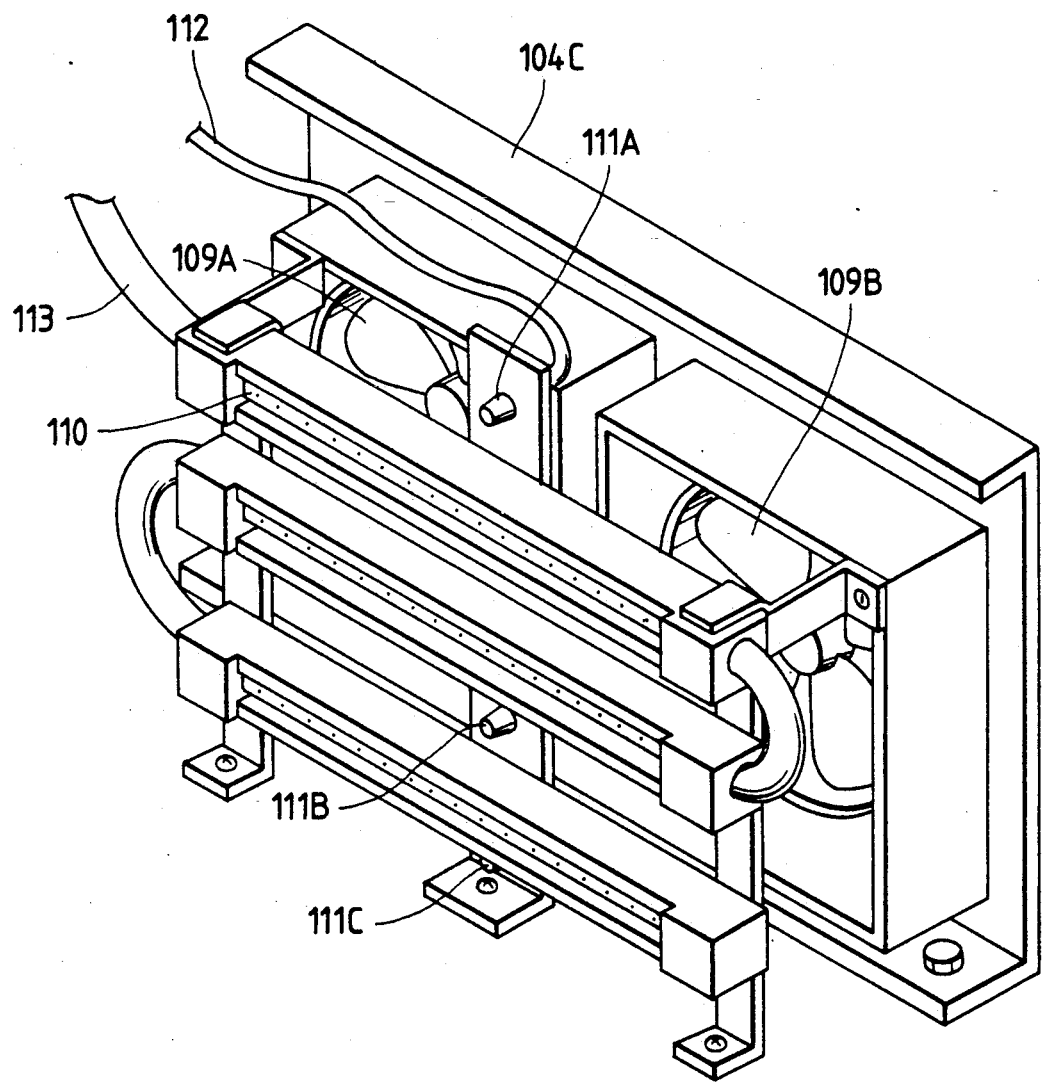
FIG. 5 is a perspective view showing the portion where an ion generating device is provided.
Figure 6:
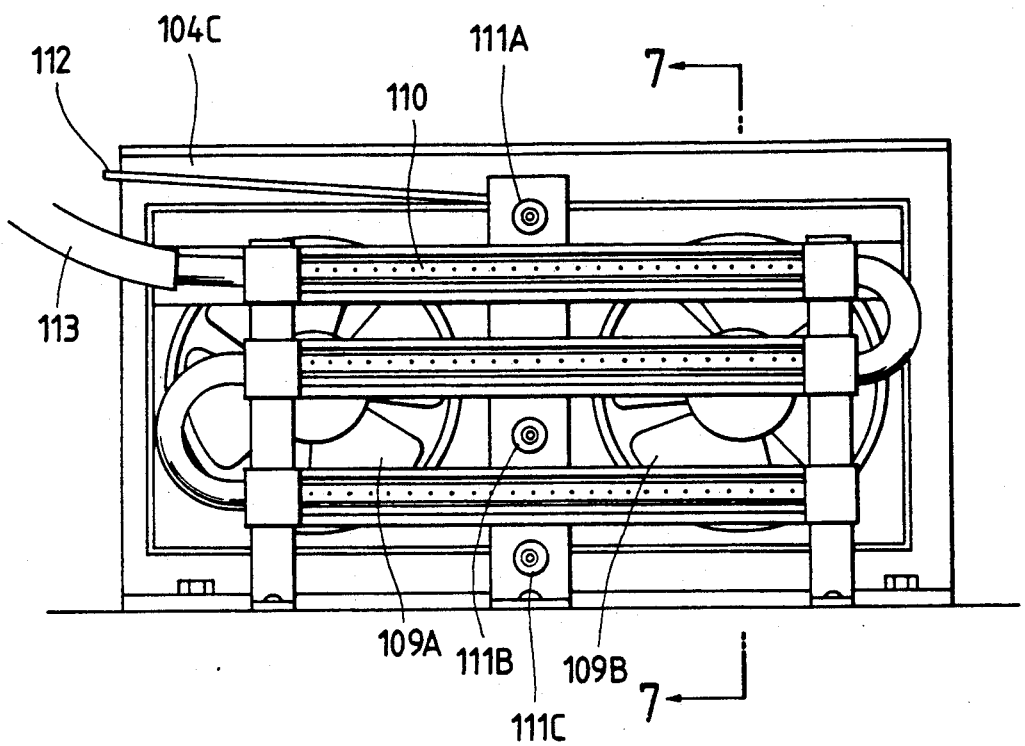
FIG. 6 is a front-elevational view as viewed from the inside of an air duct.
Figure 7:
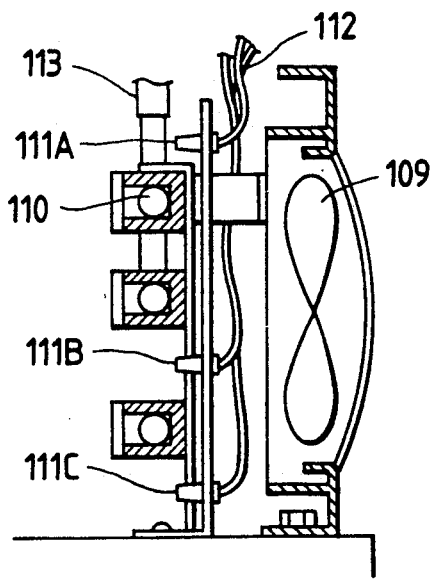
FIG. 7 is a cross-sectional view taken along the line 7—7 of FIG. 6.

An ion generating device 110 is mounted on the front side of the blower fans 109A and 109B, as shown in FIG. 5 (a perspective view of that portion where the ion generating device is provided), FIG. 6 (a front-elevational view as viewed from the inside of the air duct 104) and FIG. 7 (a cross-sectional view taken along the line 7—7 of FIG. 6).

Air jet injecting nozzles 111A, 111B and 111C are provided between the blower fans 109A and 109B, and are disposed perpendicular to the board travel path and in a plane parallel to the travel path of the board. The air jet injection nozzles 111A, 111B and 111C serve to transfer the separated film, fed into the air duct 104, to the separated film receiving container 106.

Next, the transfer of the separated film (transferred by the first film transfer belts 6A, 6B and the separated film guide members 6C) to the separated film receiving container 106 by the film transfer device 6D will be described.

Figure 8:
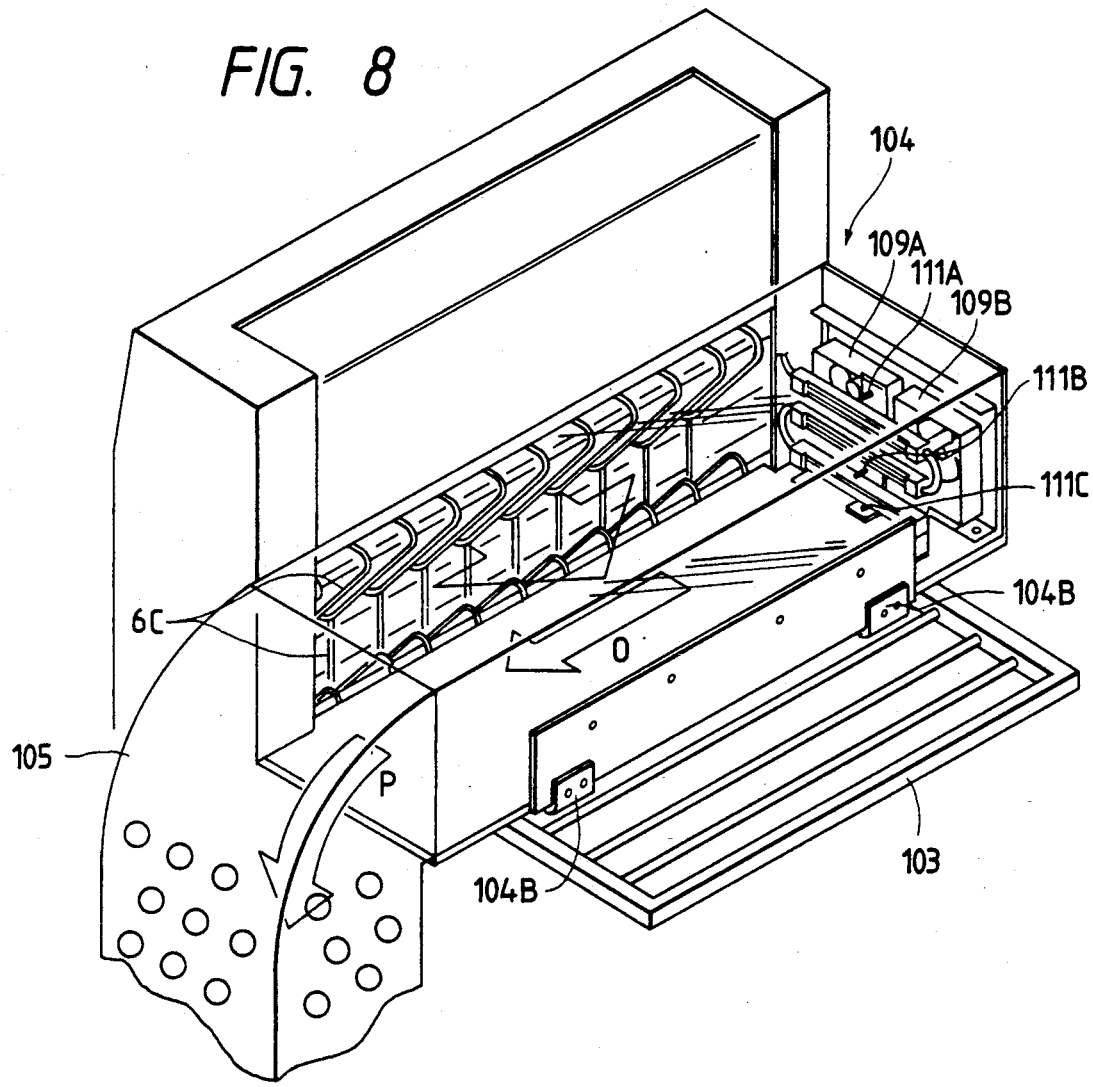
FIG. 8 is a view illustrative of the operation of a second film transfer device shown in FIG. 3.

As shown in FIG. 8, a fluid (air containing ions) is injected from the air jet injecting nozzles 111A and 111C onto the separated film in a direction O generally perpendicular to the board travel path in a plane parallel to the surface of the board. Further, after a predetermined time period during this injecting operation, a horizontal fluid (air containing ions) is injected from the air jet injection nozzle 111B into the separated film at the central portion of the transfer path. By doing so, the separated film is transferred to the inlet of the separated film discharge duct 105 via the end of the air duct 104. At this time, at that portion of the separated film discharge duct 105 disposed at a level lower than that of the horizontal fluid in the air duct 104, the pressure of the fluid is reduced because of the provision of the large number of through holes formed through the separated film discharge duct 105. Thereafter, when the separated film is to be received in the separated film receiving container 106, the fluid pressure is quickly reduced further to substantially zero, because the separated film discharge duct 105 has a large number of through holes and because the separated film receiving container is made of netting. As a result, the separated film drops by gravity and is received in the separated film receiving container.

As described above, in the film peeling apparatus, part of the cover film bonded to the printed circuit board 1 is separated therefrom, and the cover film is separated in such a manner that the film separation is started at that portion of the film immediately adjacent to the thus separated part, and then the thus separated film is discharged. More specifically, the film peeling apparatus comprises the first film transfer belts 6A, 6B which hold the separated part of the cover film, and separate the cover film from the printed wiring-purpose board, and transfers the cover film upwardly from the top surface of the printed circuit board while holding the separated film, and the film transfer device 6D which supports the separated film transferred by the first film transfer device, and injects a fluid onto the cover film in the direction perpendicular to and in a plane parallel with the path A—A of travel of the printed circuit board 1, thereby transferring the film. With this construction, the length of the transfer path during which the separated film while this film is held (that is, the length of transfer by the first film transfer belts) can be reduced by a length corresponding to the length of transfer by the film transfer device 6D. Furthermore, an incomplete transfer (i.e., jamming) of the separated film in the path of discharge of the separated film can be reduced. Also, the film transfer device 6D is constituted mainly by the air jet injecting nozzles 111A to 111C, permitting many parts such as rollers and belts to be omitted, thus reducing the number of component parts. Therefore, the second film transfer device can be of a simple construction. As a result, the manufacturing cost of the film transfer apparatus can be reduced, and the maintenance of the film transfer apparatus can be made easily.

Further, by providing the film transfer device 6D above the path A—A of travel of the printed circuit board 1 and a position upstream of the position where the cover film is separated, not only are the above advantages achieved, but the possibility that foreign matter will adhere to the separated film or that foreign matter from the second film transfer device 7D will adhere to the photosensitive resin layer on the printed circuit board 1, will be reduced. This increases the yield with respect to the manufacture of the printed circuit board 1.

Further, by providing the separated film receiving container 106 (which receives the separated film transferred by the second film transfer device 7D) at a low level on the side of the path A—A of travel of the printed circuit board 1, the discarding of the discharged films and the handling of the separated film receiving container 106 can be done efficiently.

Further, the single separated receiving container 106 serves as a separated film receiving container for receiving the upper cover film on the front side of the printed circuit board 1, and also serves as a separated film receiving container for receiving the lower cover film on the reverse side of the board 1. Thus, the size thereof can be reduced, and therefore the overall size of the film peeling apparatus can be reduced.

Further, the second film transfer means injects the fluid onto the separated film in the direction generally perpendicular to the board travel path in the plane parallel to the top surface of the board, and after a predetermined time period during this injecting operation, the horizontal fluid is injected onto the separated film at the central portion of the transfer path. At the end of the horizontal fluid, the vertical film discharge passage is provided, and at that portion of the vertical film discharge passage lower than the horizontal fluid, the fluid pressure is reduced, so that the fluid pressure is rapidly reduced to substantially zero in the separated film receiving portion. Therefore, the incomplete transfer of the separated film can be reduced, and the separated film can be received in the container efficiently.

Further, the air duct 104 and the separated film discharge duct 105 are transparent, and part of the air duct 104 is operable. With this arrangement, when the separated film is jammed, this can immediately be inspected with the eyes, and the jammed film can be easily removed. Thus, the maintenance can be made easily.

While the present invention has been specifically described with reference to the preferred embodiment thereof, the invention itself is not to be restricted to the above embodiment, and various modifications can be made without departing the scope of the invention.

For example, the present invention is applicable to apparatus for peeling a protective film bonded to a decorative plate for a building structure.

What is claimed is:

1. A film peeling method wherein a film adhered to a surface of a board is initially peeled therefrom and subsequently conveyed, comprising:
   separating part of said film from said board at an edge of said board;
   holding said separated part of the film and applying a peeling force thereto;
   simultaneously separating the remaining part of the film and initially transferring away said film from said surface of the board while holding the film;
   introducing the peeled and initially transferred film into a duct wherein a static electricity eliminating fluid is substantially constantly flowing along a transfer path of the peeled film; and
   initially injecting a first pressurized fluid into said duct so as to generate fluid flow along an upper wall and a bottom wall of said duct, respectively, and after a predetermined time period injecting a second additional pressurized fluid onto the peeled and initially transferred film in synchronism with the peeling action so as to secondarily transfer the peeled film to a peeled film receiving station, said first and second fluids being injected onto the film in an injection direction substantially perpendicular to a path of travel of the board and in a plane parallel to the surface of the board so as to cause said film to travel in a direction parallel to said injection direction along a horizontal transfer path.

2. A film peeling method according to claim 1, in which said static electricity eliminating fluid contains ions.

3. A film peeling method according to claim 1 wherein said film is directed to a vertical film discharge passage comprising a portion of a transfer path at the end of said horizontal transfer path by the pressurized fluid and the fluid pressure is reduced at a portion of said vertical film discharge passage below the horizontal transfer path.

4. A film peeling apparatus for peeling a film adhered to a surface of a board and conveying the peeled film comprising:
   means for separating a part of said film from said board at a leading edge thereof;
   means for gripping said separated part of said film and applying a peeling force to remove the remainder of said film from said surface;
   first means for transferring said peeled film along a transfer path in a first direction opposite to the direction in which said board is conveyed;
   a duct disposed along said transfer path wherein a static electricity eliminating fluid is substantially continuously flowing in a second direction substantially perpendicular to said first direction and in a plane parallel to the surface of said board;

means for eliminating static electricity in the fluid before said fluid flows into said duct;

means for initially injecting a first pressurized fluid into said duct so as to generate fluid flow along an upper and lower wall of said duct, respectively, and after a predetermined positive time period injecting a second additional pressurized fluid onto said peeled and initially transferred film at a center of said duct substantially perpendicular to said first direction and in a plane parallel to the surface of said board in synchronism with the peeling action so as to secondarily transfer the peeled film in said second direction; and a peeled film receiving means for receiving the secondary transferred film.

5. A film peeling apparatus according to claim 4, further comprising means for rapidly reducing the fluid pressure to substantially zero in said peeled film receiving means.

6. A film peeling apparatus according to claim 4, wherein said duct is made of a transparent material.

7. A film peeling apparatus according to claim 6, in which an upper wall and one side wall of said duct are formed integrally with each other to provide an integral portion which is connected by a hinge to a body portion for movement between an open position, providing access to said transfer path, and a closed position.

8. A film peeling apparatus according to claim 4 wherein said gripping means and first transferring means comprises adjacent movable belts, having a frictional interface therebetween defining a portion of said transfer path.

9. A film peeling apparatus according to claim 4 wherein said static electricity eliminating fluid is blown into said duct by blower fans disposed at one end of said duct, said first pressurized fluid is injected into said duct by a fluid jet injecting nozzle provided at upper and lower positions of said duct wall, and said second pressurized fluid is injected into said duct by a fluid jet injecting nozzle provided at a center position of said duct wall between said blower fans.

10. A film peeling apparatus according to claim 9 wherein said means for eliminating a static electricity comprises an ion generating device mounted on the front side of said blower fans.

* * * * *